United States Patent
Harned et al.

(10) Patent No.: US 7,184,124 B2
(45) Date of Patent: Feb. 27, 2007

(54) LITHOGRAPHIC APPARATUS HAVING AN ADJUSTABLE PROJECTION SYSTEM AND DEVICE MANUFACTURING METHOD

(75) Inventors: Robert D. Harned, Redding, CT (US); Cheng-Qun Gui, Best (NL); Nora-Jean Harned, Redding, CT (US)

(73) Assignee: ASML Holding N.V., Veldhoven (NL)

( * ) Notice: Subject to any disclaimer, the term of this patent is extended or adjusted under 35 U.S.C. 154(b) by 177 days.

(21) Appl. No.: 10/975,086

(22) Filed: Oct. 28, 2004

(65) Prior Publication Data
US 2006/0092393 A1 May 4, 2006

(51) Int. Cl.
G03B 27/52 (2006.01)
G03B 27/54 (2006.01)

(52) U.S. Cl. .......................................... 355/67; 355/55
(58) Field of Classification Search .................. 355/53, 355/55, 57, 60, 67
See application file for complete search history.

(56) References Cited

U.S. PATENT DOCUMENTS

| | | | | |
|---|---|---|---|---|
| 3,748,015 A | * | 7/1973 | Offner | ........................ 359/366 |
| 5,625,436 A | | 4/1997 | Yanagihara et al. | |
| 6,636,350 B2 | | 10/2003 | Shafer et al. | |
| 6,639,732 B2 | | 10/2003 | Omura et al. | |
| 6,665,126 B2 | | 12/2003 | Shafer et al. | |
| 2003/0137644 A1 | | 7/2003 | Tanaka et al. | |
| 2003/0147128 A1 | | 8/2003 | Shafer et al. | |
| 2003/0234992 A1 | | 12/2003 | Shafer | |
| 2004/0001191 A1 | | 1/2004 | Kohda et al. | |
| 2004/0013956 A1 | * | 1/2004 | Sogard | ........................ 430/30 |
| 2004/0263429 A1 | | 12/2004 | Hamed et al. | |
| 2005/0023573 A1 | | 2/2005 | Govil et al. | |
| 2006/0028703 A1 | | 2/2006 | Govil et al. | |

FOREIGN PATENT DOCUMENTS

| | | |
|---|---|---|
| EP | 1 318 425 A2 | 6/2003 |
| EP | 1 318 425 A3 | 6/2003 |

\* cited by examiner

*Primary Examiner*—Rodney Fuller
(74) *Attorney, Agent, or Firm*—Sterne, Kessler, Goldstein & Fox P.L.L.C.

(57) ABSTRACT

A system and method use a pattern generator to pattern illumination that is projected using an adjustable projection system to form one or more devices on a substrate. The adjustable projection system includes at least one active mirror, which is adjusted to compensate for errors found on a surface of the pattern generator, the substrate, and or an optical element in the lithography system. In one example, the adjustable projection system includes two concave and one convex mirrors, while in another system the adjustable projection system also includes one or two fold mirrors. At least one of the mirrors in these two examples is an active mirror, which is used for the compensating. In this arrangement, local focus and/or magnification errors can be substantially reduced or eliminated.

24 Claims, 7 Drawing Sheets

LITHOGRAPHIC APPARATUS HAVING AN ADJUSTABLE PROJECTION SYSTEM AND DEVICE MANUFACTURING METHOD

BACKGROUND OF THE INVENTION

1. Field of the Invention

The present is related to a projection system in lithography system.

2. Background Art

In lithography systems, pattern generators are used to pattern substrates during an exposure process. Example lithography systems include, but are not limited to, reflective or transmissive maskless, immersion, and mask-based systems. Example substrates (e.g., work pieces) include, but are not limited to, semiconductor wafers, flat panel display substrates, flexible substrates, and the like. Light interacting with an illumination spot on the pattern generator become patterned. The patterned light is projected using a projection optical system onto one or more target areas of the substrate during the exposure process to form features on a photosensitive material (e.g., a photoresist) on the substrate.

Unfortunately, non-uniformity of a surface of the pattern generator, the substrate, and/or optics associated with the projection system can cause local magnification and/or focus errors, resulting in errors in patterns being formed on the substrate. As glass substrates grow larger and larger with each new generation of flat panel display produced therefrom, it becomes increasingly difficult to have flat and uniform thickness across the glass substrate. Also, as stages become larger to hold the large glass substrates, it become increasingly difficult to maintain the flatness of the substrate stage. Another cause of magnification errors can be temperature variation. Any one or more of these factors contribute to focus and/or magnification error.

Therefore, what is needed is a system and method that can be used to for local magnification errors and/or focus errors caused by non-compensate uniformity of a surface of a pattern generator, a substrate, and/or an optical element in at least a projection system of a lithography system.

BRIEF SUMMARY OF THE INVENTION

One embodiment of the present invention provides a lithography system comprising a pattern generator, a substrate, and a projection system that directs light from the pattern generator to the substrate via first through third reflection devices. At least one of the first through third reflection devices is an active reflection device. The lithography system also comprises a measurement system that measures characteristics about at least one of the pattern generator, the substrate, and the projection system and produces a measurement signal. A controller, based on the measurement signal, produces a control signal to control the at least one active reflection device.

Another embodiment of the present invention provides a method of making a device comprising the following steps. Patterning a beam of radiation with a pattern generator. Projecting the patterned beam to a target portion of a substrate using a projection system that directs light from the pattern generator to the substrate via first through third reflection devices. Providing an active reflection device as at least one of the first through third reflection devices. Measuring characteristics of at least one of the pattern generator, the substrate, and the projection system to produce a measurement signal. Controlling, based on the measurement signal, the at least one active reflection device.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a system and method using a pattern generator to pattern illumination that is projected using an adjustable projection system to form one or more devices on a substrate. The adjustable projection system includes at least one active mirror, which is adjusted to compensate for errors found on a surface of the pattern generator, the substrate, and or an optical element in the lithography system. In one example, the adjustable projection system includes two concave and one convex mirrors, while in another system the adjustable projection system also includes one or two fold mirrors. At least one of the mirrors in these two examples is an active mirror, which is used for the compensating. In this arrangement, local focus and/or magnification errors can be substantially reduced or eliminated.

Terminology

Throughout the description, the use of the terms "pattern generator" and "pattern generating devices," unless otherwise described, include a reflective and transmissive reticle, mask, contrast device, liquid crystal display, spatial light modulator, grating light valve, digital mirror device, or any other device that can be used to impart a pattern onto a light beam, as will become apparent to one or ordinary skill in the art upon reading this description.

The use of "system" or "lithography system," unless otherwise described, is meant to include photolithography, direct write lithography, maskless lithography, immersion lithography, and the like.

The use of "light" or "radiation" is meant to include any wavelength desired for a particular application.

The use of "deformable optical element" or "active optical element" refers to an optical element that can be tilted, translated, or whose shape can change through actuation of two or more areas on its surface to expand or contract the surface. This can be used to change a surface area, radius of curvature, or the like. An active optical element can be formed using integrated circuit techniques in order to make them very densely packed. For an example active optical element formed using integrated circuit techniques, see U.S. appl. Ser. No. 10/629,798 ("the '798 App."), filed Jul. 8, 2003, entitled "Deformable Mirror Using Piezoelectric Actuators Formed as an Integrated Circuit and Method of Use," which is incorporated herein by reference in its entirety.

The use of "solid optical element" or "fixed optical element" refers to an optical element whose characteristics do not change.

Exemplary Environments

Figure 1:
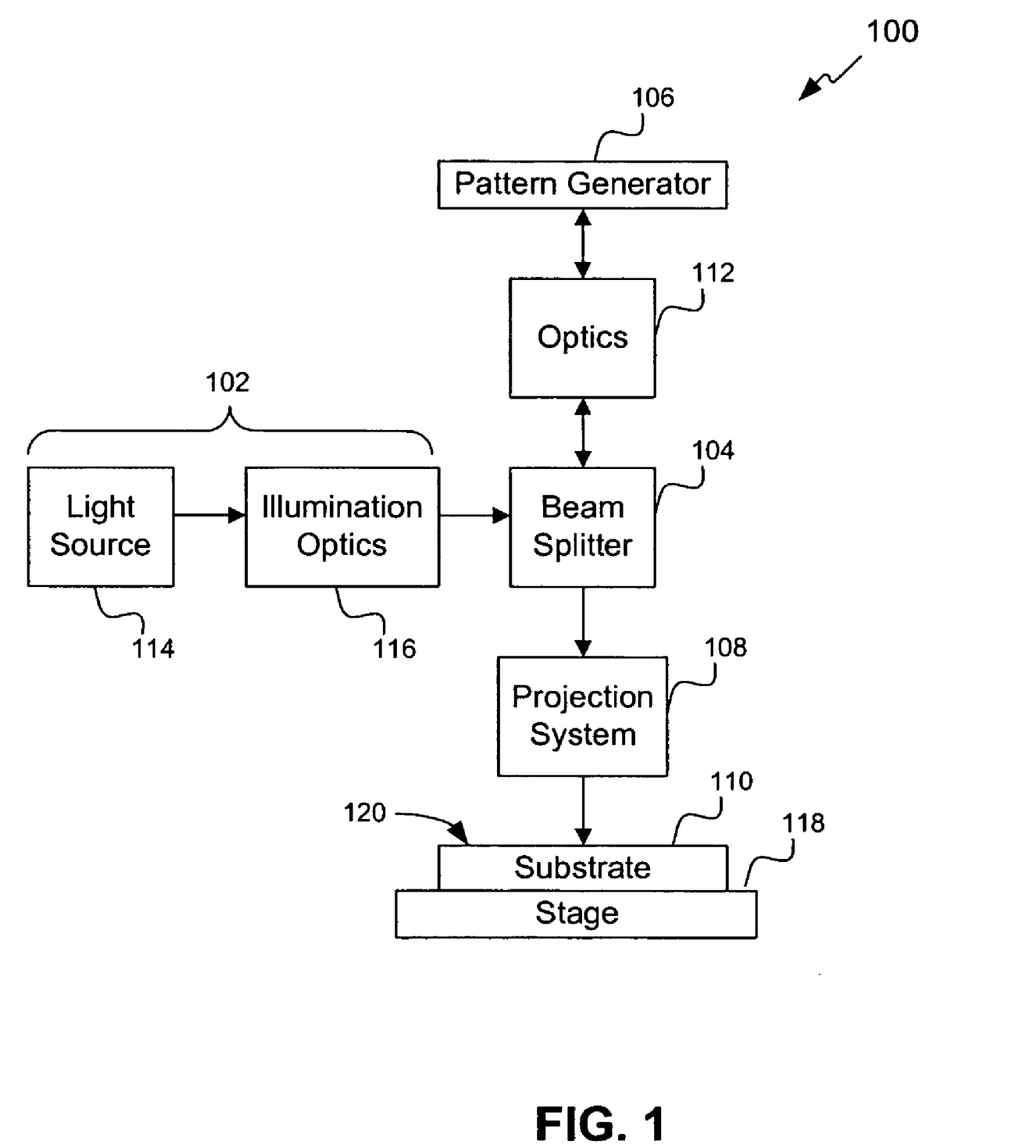
FIGS. 1, 2, and 3 show various lithography systems, according to various embodiments of the present invention.

FIG. 1 shows a lithography system 100, according to one embodiment of the present invention. System 100 comprises an illumination system 102, a beam splitter 104, a pattern generator 106, a projection system 108, and a substrate 110. In this embodiment, pattern generator 106 is a reflective pattern generator, so this may be called a reflective lithography system.

In one example, system 100 also comprises optics 112 between pattern generator 106 and beam splitter 104.

In one example, illumination system 102 includes a light source 114 and illumination optics 116.

During lithography, substrate 110 is disposed on a substrate stage 118 and is exposed to an image (e.g., a pattern) formed by pattern generator 106, or an array thereof. The substrate stage 118 is used to align and move the substrate for accurate exposure. The image is projected onto substrate 110 by projection optics 108.

It is to be appreciated that, while projection optics 108 are used in the case of lithography, a different type of exposure apparatus can be used depending on the particular application. For example, an excimer laser, x-ray, ion, electron, or photon lithography can each require a different exposure apparatus, as is known to those skilled in the art. The particular example of lithography is discussed here for illustrative purposes only.

Pattern generator 106 is used in lithography system 100 to pattern light, which forms images that are used to form features on substrate 110. Pattern generators 106 can include, but are not limited to, static pattern generators, such as reticles (or masks), or active pattern generators, such as spatial light modulators (SLMs) or contrast devices (hereinafter, both are referred to as SLMs), for example digital mirror devices (DMDs), liquid crystal displays (LCDs), grating light valves (GLVs), liquid crystal on silicon (LCOS), or the like, or any other elements that include a transmissive and/or reflective pattern can be used as pattern generators. These active pattern generators are typically driven by a computer.

Substrate 110 can include, but is not limited to, a substrate used in the manufacture of flat panel displays (e.g., liquid crystal displays), circuit boards, various integrated circuits, flexible fluidic nano devices, print heads, or the like. A frequently used material for substrate 110 for such applications is a semiconductor wafer or flat panel display glass substrate. Thus, it is to be appreciated that, while a portion this description is written in terms of a semiconductor wafer for illustrative purposes, one skilled in the art would recognize that this description also applies to other types of substrates known to those skilled in the art.

The projected image produces changes in the characteristics of a layer (not shown) (e.g., photoresist) deposited on a surface 120 of substrate 110. These changes correspond to features in the image projected onto substrate 110 during exposure. Subsequent to exposure, surface 120 can be etched to produce a patterned layer. The pattern corresponds to the features projected onto substrate 110 during exposure. This patterned layer is then used to remove or further process exposed portions of underlying structural layers within substrate 110, such as conductive, semiconductive, or insulative layers. This process is then repeated, together with other steps, until the desired structures or features have been formed on surface 120, or in various layers, of substrate 110.

Step-and-scan technology works in conjunction with projection system 108 that has a narrow imaging slit (not shown). Rather than expose all of surface 120 at one time with the image formed by pattern generator 106, individual fields are scanned onto substrate 110 one at a time through an imaging slit. This is accomplished by moving the pattern formed by the pattern generator 106 relative to substrate 110, such that the imaging slot is moved across the field during the scan. In one example, substrate stage 118 is stepped between field exposures to allow multiple copies of the pattern formed by pattern generator 106 to be exposed over the substrate layer. In this manner, the quality of the image projected onto substrate 110 is maximized.

Figure 2:
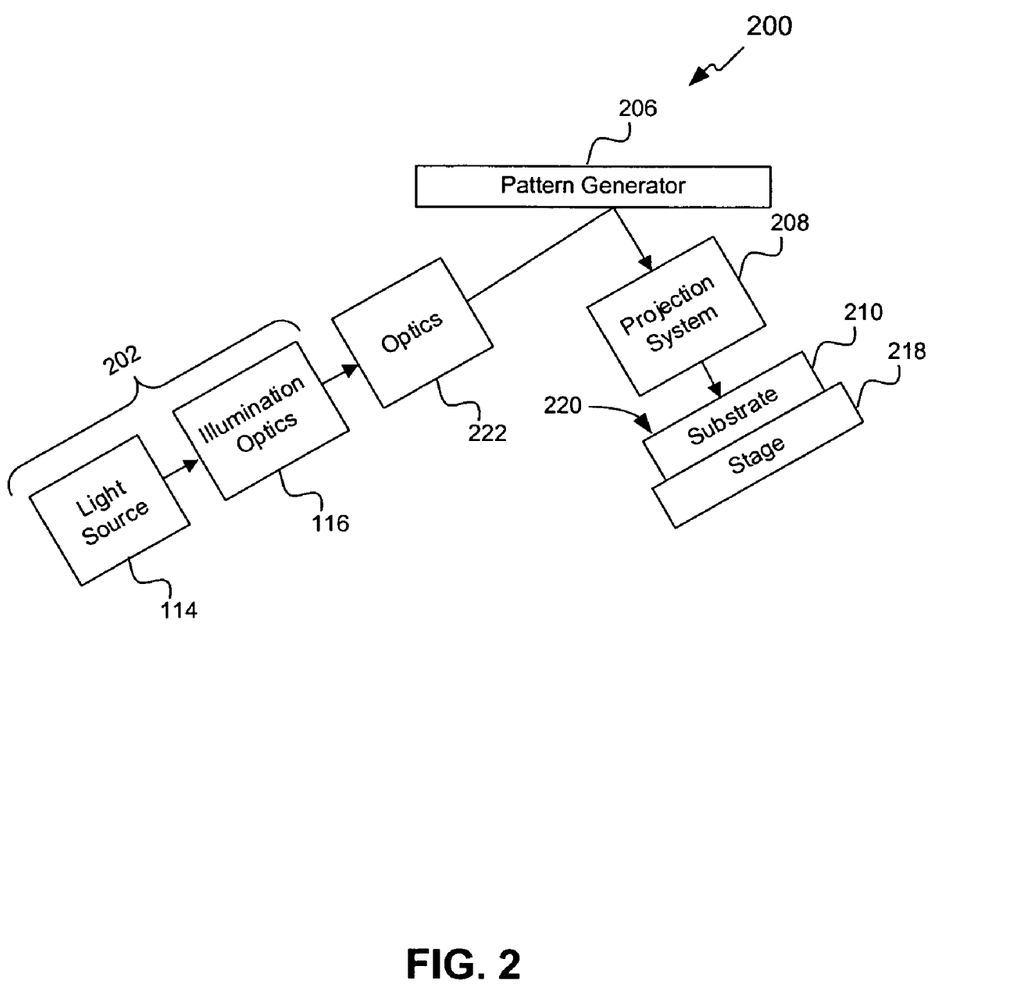
Figure 3:
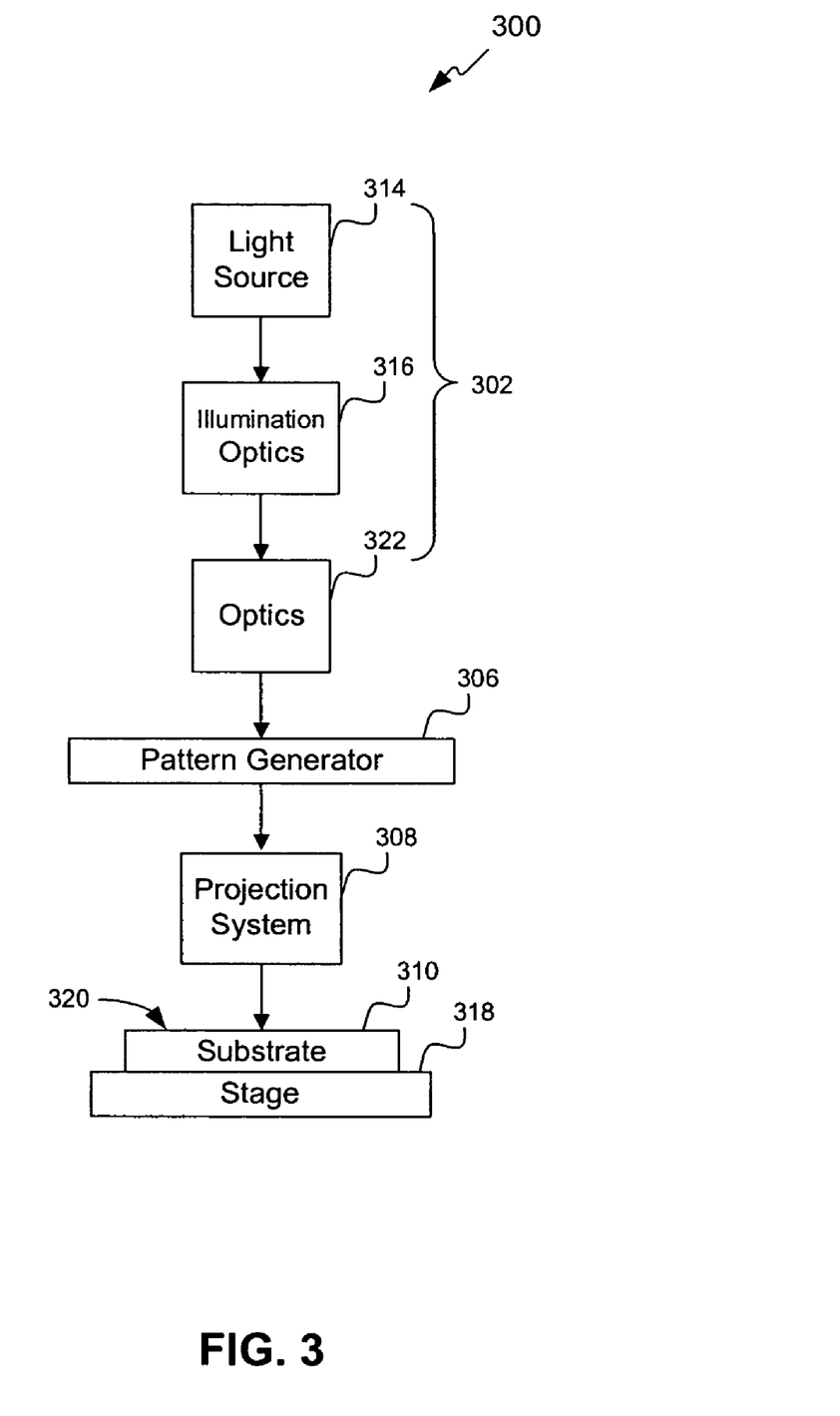

FIGS. 2 and 3 show lithography systems 200 and 300, respectively, according to various embodiments of the present invention.

FIG. 2 is another arrangement for a reflective lithography system. A main difference, as compared to the embodiment shown in FIG. 1, is that beam splitter 104 is removed and light is directed to pattern generator 206 from optics 222. Otherwise, system 200 operates similar to as described above.

FIG. 3 is a transmissive lithography system, which means light passes through a transmissive pattern generator 306. Other than this change, system 300 operates similar to as describe above.

Although the rest of this description is in terms of a transmission lithography system, as shown in FIG. 3, the concepts and arrangements described herein can be used in a reflective lithography system, as shown in FIGS. 1 and 2.

Exemplary Fixed Projection Systems for Flat Panel Display Manufacture

In the following description, a flat panel display is used as substrate 310, and elements in system 300 of FIG. 3 will be used since the description is for a transmissive lithography system. Also, the following description is in terms of a reticle or mask being used as pattern generator 306. However, these examples are for explanation only, and are not meant to be limiting.

In order to form features on substrate 310 an image from reticle 306 is scanned through projection system 308. In one example, a slit height of substrate 310 is about 525 mm, and projection system 308 scans this surface area. As described above, a field in the shape of a slit is imaged by projection system 308. Thus, imaging is performed for an area on substrate 310 that is about 20 mm wide by 525 mm high. Using a single projection system 308 to scan a large substrate 310 requires extremely large optics. Industry standards measure FPD's in inches, with current production up to about a 42" diagonal FPD with much larger dimensions envisioned for future production. For example, projection system 308 can include a concave and a convex mirror that are both on the order of about 60 inches in size. This can be very expensive because the price of optics increases exponentially with size. As discussed above, these parameters result in a slit width of about one to two millimeters. In one example, to increase the slit width, lenses are added to projection system 308.

In one example, system 300 operates with a light source wavelength in about a 365 nm to 436 nm range, which is considered violet range. However other wavelength ranges are possible, as would be apparent to one of ordinary skill in the art upon reading and understanding this description.

In one example (not shown), a lithography system uses several projection systems 308 or several combination systems including corresponding illumination systems 102 and projection systems 308. In this arrangement, instead of imaging an entire pattern of a pattern generator at once, several optical systems are used to direct the image from the pattern generator to a substrate. The optical systems are aligned and stacked in a column that is perpendicular to the direction of the scan. For example, five to seven optical systems can be used, where each images about 125 mm of the 525 mm substrate 310. In an example using radiation in the violet range, the optical systems operate at a 1× magnification, so reticle 306 is the same size as flat-panel display substrate 310. In other examples, such as systems using radiation in a 193, 248, or a 157 nm range (e.g., deep ultra violet (DUV) or extreme ultra violet (EUV) ranges) the magnification may be at a 4× reduction, in which a pattern on the reticle 306 is four times larger than the image patterned on substrate 310.

Typically, the five or seven optical systems are stacked in a vertical direction, perpendicular to the scan direction. Each of the optical systems can be bigger in size than the area that is being imaged from reticle 306. For example, one of the optical systems is imaging an area that is about 125 mm by 20 mm. In this arrangement, each optical system includes at least one lens with a diameter of about 200 mm. Because their size, the lenses cannot be positioned one of top of each other, i.e., vertically aligned. The lenses need to be displaced laterally. As a result of using five optical systems, there is an image inversion problem that requires additional optical elements to correct. Also, the optical systems must be accurately aligned.

Another consideration in designing projection system 308 is the relationship between a resolution and a numerical aperture of projection system 308 (or an F number of the projection system, i.e., a ratio of a focal length to a diameter of the projection system). In one example, features that are 2.5 microns in size are recorded on substrate 310 to build up a circuit pattern. To do that, a numerical aperture of 0.12 is needed, which is an F number of about 4.

Depth of focus also needs to be considered, which is related to the numerical aperture. The depth of focus is fixed, and cannot be controlled. The chosen resolution and a wavelength of light determine the depth of focus. For example, with an F number of about 8, a lens has a range of focus within a 50 micron range in object space, i.e., objects within this range will be in focus. As another example, with an F number of about 2, a lens has a range of focus of about 4 microns. Also, because substrate 308 is not perfectly flat, the depth of focus results in some of the areas on reticle 306 not being imaged adequately onto substrate 310. Thus, a drawback of conventional systems is that they typically require an almost perfectly flat surface for both reticle 306 and substrate 310

One way this has been overcome is to adjust each optical system so that it is focused over smaller regions. For example, the flat-panel display substrate 310 can be effectively divided into smaller substrates that are imaged separately.

Exemplary Adjustable Projection Systems for Flat Panel Display Manufacture

In order to overcome the problems in a stacked optical system as described above, the inventors have developed a projection system utilizing active optical elements. Using active optical element can, for example, allow increased control over focus and magnification.

Figure 4:
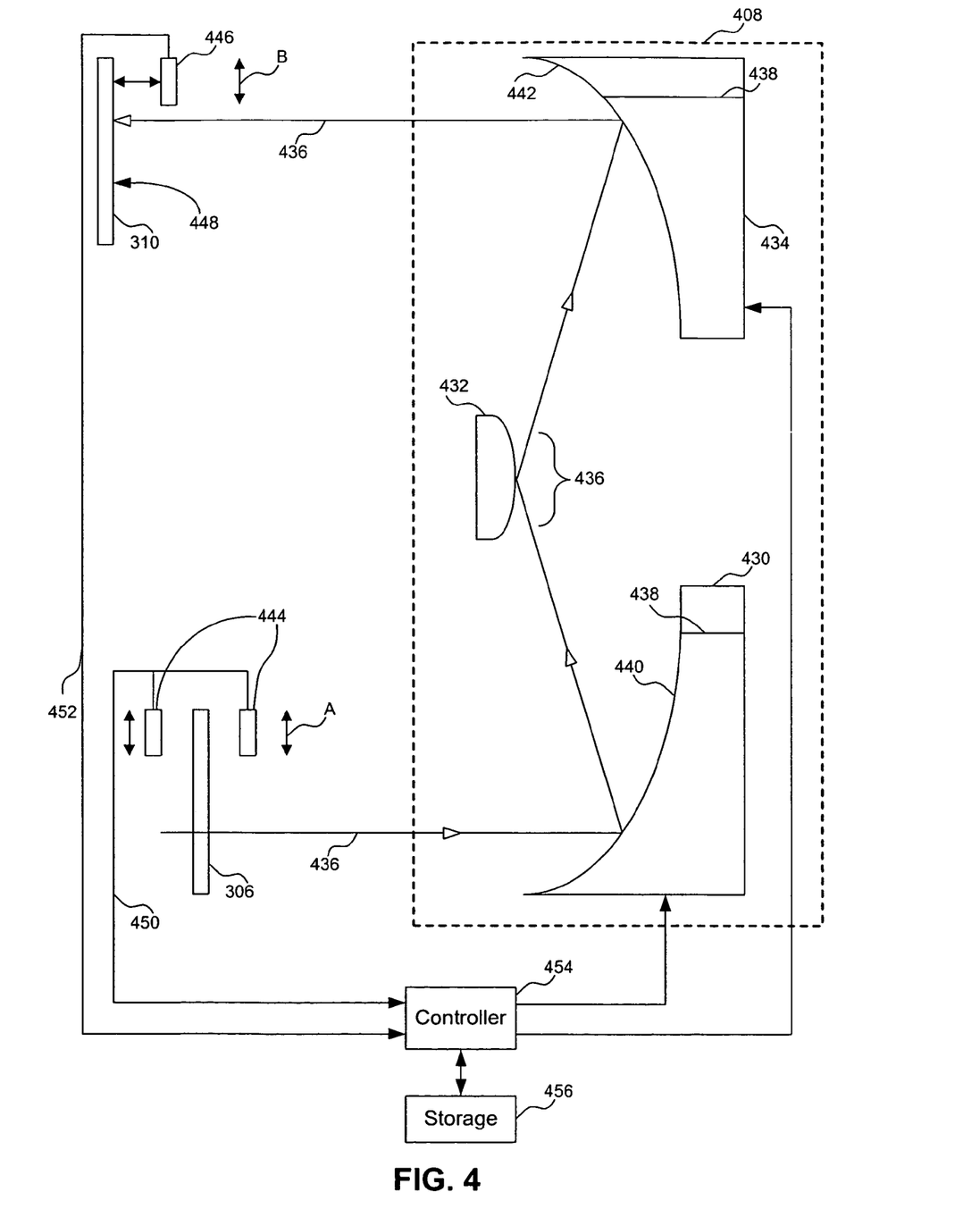
FIG. 4 shows an adjustable projection system, which can be located in an environment shown in FIG. 3, according to one embodiment of the present invention.

FIG. 4 shows an adjustable projection system 408, which can be located in an environment shown in FIG. 3, according to one embodiment of the present invention. Projection system 408 includes a first optical element 430 (e.g., a first concave mirror), a second optical element 432 (e.g., a convex mirror), and a third optical element 434 (e.g., a second concave mirror). Patterned light 436 is produced by transmission through reticle 306. Patterned light 436 is then reflected by first concave mirror 430 to convex mirror 432. Patterned light 436 is then reflected to second concave mirror 434, which in turn reflects patterned light 436 onto substrate 310. In projection system 408 at least one of mirrors 430 or 434 is an active mirror. One or more actuators 438 are coupled to a base 440 and 442, respectively, of the at least one mirror 430 or 434.

In this embodiment, in order to control the active mirror(s) a measurement is made of either one or both surfaces of reticle 306 and an imaged surface 448 of substrate 310. In one example, a measuring system 444 is used to scan one or both surfaces of reticle 306 and a measuring system 446 is used to scan the surface 448 of substrate 310. Measuring systems 444 and 446 can move in the directions of arrows A and B, respectively. Signals 450 and 452 are transmitted from measuring systems 444 and 446, respectively, to a controller 454. Signals 450 and 452 are used to generate information about the surfaces of reticle 306 and substrate 310, which is stored in storage 456. During an exposure operation, controller 454 accesses the stored information from storage 456 and uses the information to control one or both mirrors. Through this control, optical characteristics of patterned beam 436 are optimized before exposing a pattern from reticle 306 onto substrate 310. This can be done either before or during (i.e., in real time) an exposure process.

As discussed above, an active mirror typically has actuators 438 on a back surface of the mirror, which are used to bend the mirror to adjust its radius of curvature, or other optical characteristics of the mirror. This can be done to correct for focusing errors, aberrations, magnification, or the like of patterned beam 436. In various examples, actuators 438 can be mechanical (e.g., piezo-electric), or can be moving the back of the mirror with air pressure, water pressure, etc. For an example active mirror, see the '798 App. discussed above.

The number of actuators 438 used depends upon what type of non-flatness errors are desired to be corrected and/or what size area on substrate 310 is being imaged. In one example, to adjust focus over a 125 mm portion of substrate 310 one or both mirrors 430 and/or 434 have 15 actuators 438 coupled to their back surfaces 440 and 442, respectively, to move surfaces 440 and/or 442 in either direction. In another example, to adjust the focus over a 50 mm region on reticle 306 and substrate 310, 60 actuators 438 would be used. In another example, to adjust focus over a 10 mm area 150 actuators 438 would be used.

In one example, through use of projection system 408, the size of mirrors 430 and 434 can be reduced from about 60 inches in a conventional system to about 20 inches. Because the cost of optics goes up with the cube of the size, this is a significant reduction in cost along with size.

Figure 5:
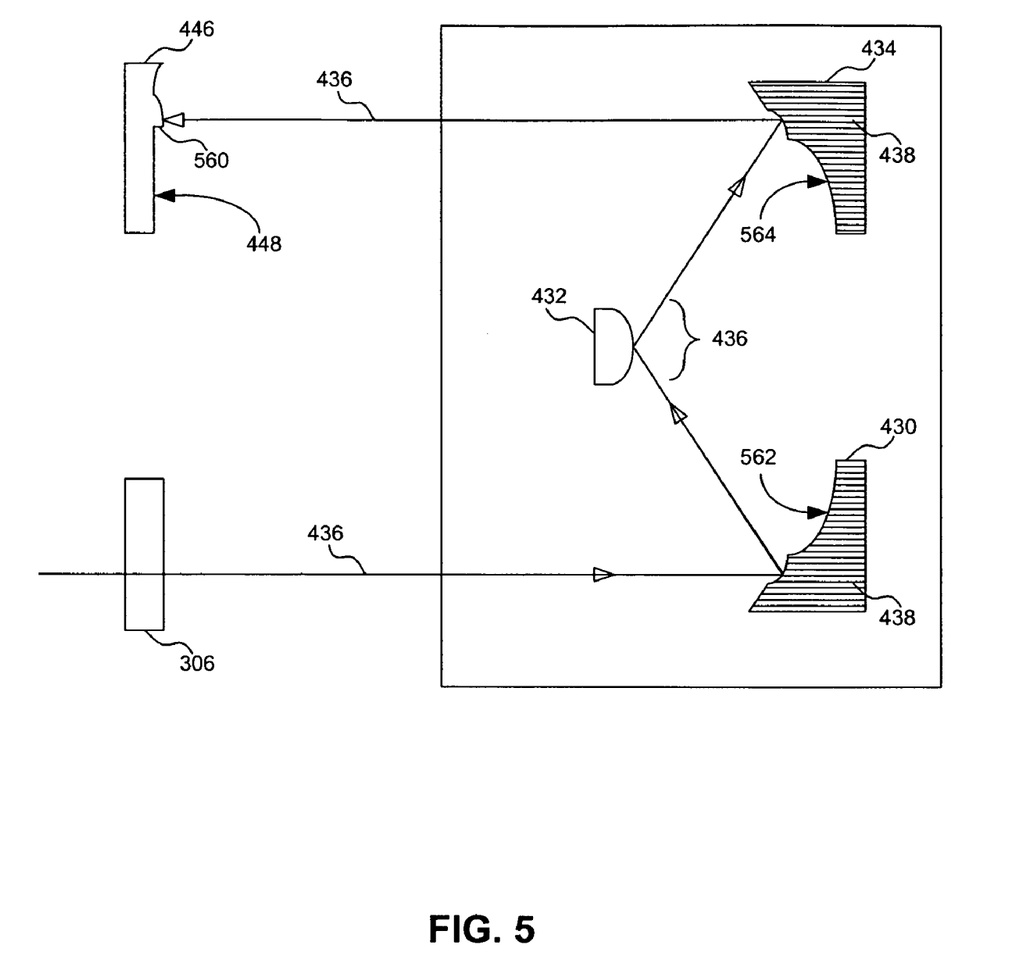
FIG. 5 shows a state of projection system after being adjusted to compensate for an error on a surface of a substrate, according to one embodiment of the present invention.

FIG. 5 shows a state of projection system 408 after being adjusted for an error 560 on surface 448, according to one embodiment of the present invention. It is to be appreciated error 560 is exaggerated as the figure is an illustrate and not to scale. If mirrors 430 and 434 were not adjusted for error 560, an image on substrate 310 would have errors, causing a feature formed from that image to have errors, and possibly make the entire device on substrate 310 inoperable. By bending surfaces 562 and 564 of mirrors 430 and 434, respectively, using actuators 438, the focus shifts so that the image is in focus on error 560. It is to be appreciated, as is discussed below, that in one example only one of mirrors 430 or 434 is adjusted to correct for this error. Having one or both mirrors 430 or 434 being active are alternative correction schemes, both of which are contemplated within the scope of the present invention.

With reference back to FIG. 4, to measure error 560, measuring system 446 scans along surface 448 of substrate 310. In one example, measuring system 446 is a detector having an elongated profile (e.g., about 525 mm high and about 1 mm wide). Detector 446 scans the length (e.g., about 700 mm) of substrate 310 to produce the information about the surface profile, as discussed above, which is used by controller 454 to generate changes needed to adjust a mirror surface profile or one or both mirrors 430 or 434.

In this example, non-flatness data is used to determine how much to change a local curvature of one or both mirrors 430 and/or 434 to adjust a images respective focus position. For example, assume mirror 430 has a nominal radius of curvature of about 1000 mm, when a reticle pattern is imaged onto substrate 310 the image ends up in a particular spot on substrate 310 that is directly related to the 1000 mm radius of curvature. In order to correct for error 560, one or both mirrors 430 and/or 434 are locally bent based the information collected by the detector(s).

In one example, the measuring of surface 448 by measuring system 446 is done in real time. In this example, surface 448 is measured a few milliseconds before being exposed, and one or both mirrors 430 and/or 434 are deformed in real time. Using real time measuring and adjusting allows for higher throughput.

In one example, it is to be appreciated that reticle 306 can also and/or instead have an error (not shown), which would be measured by measuring system 444. Once the error is measure and information collected and stored, similar operations as those described above for compensating for error 560 are performed to compensate for the error on reticle 306. In one example, reticle 306 need only be measured once because it typically will not change during exposure operations, while surface 448 of substrate 310 can change.

Figure 6:
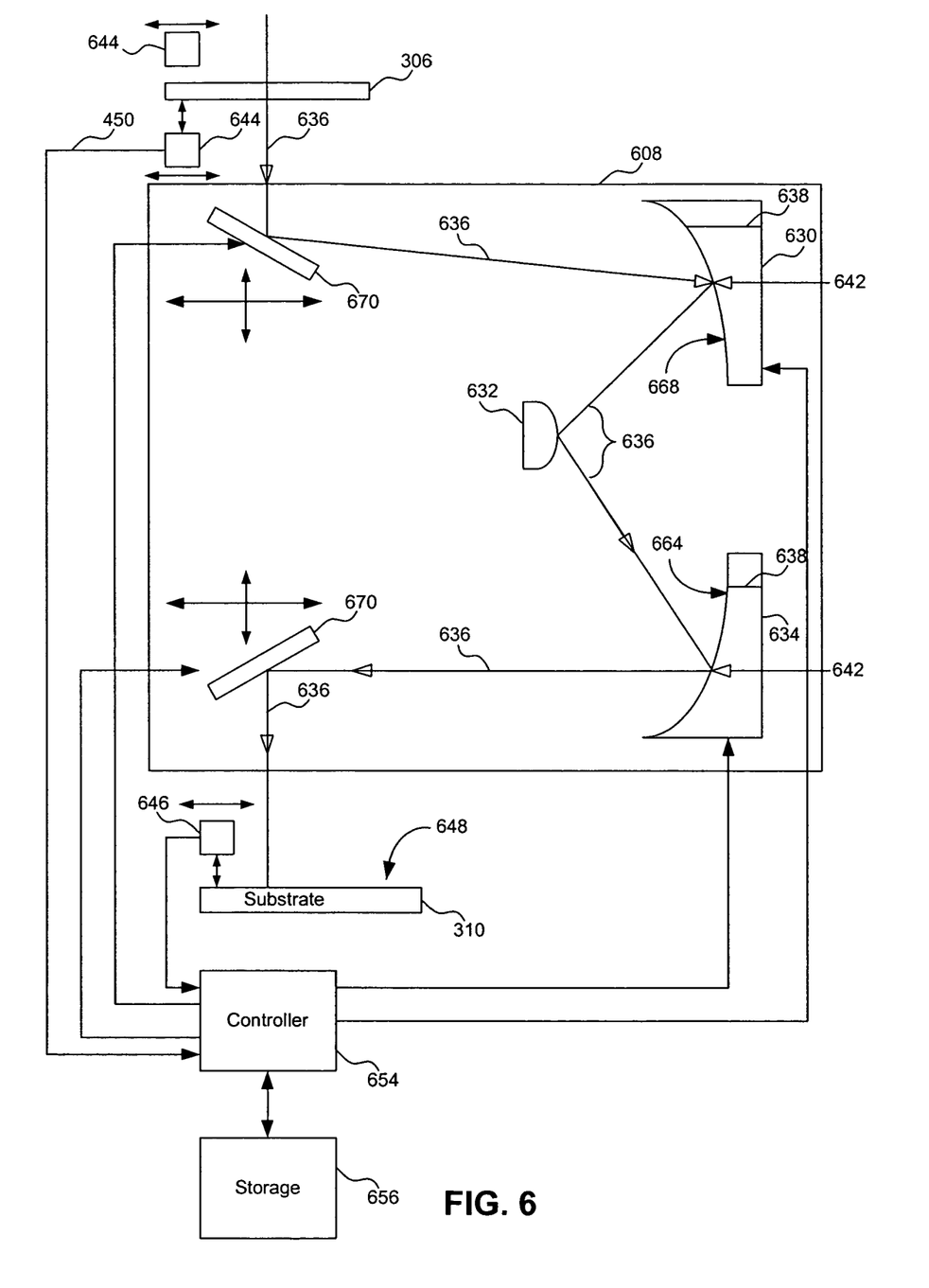
FIG. 6 shows an adjustable projection system, which can be located in an environment shown in FIG. 3, according to one embodiment of the present invention.

FIG. 6 shows an adjustable projection system 608, which can be located in an environment shown in FIG. 3, according to one embodiment of the present invention. In this embodiment, as compared to projection system 408, projection system 608 includes at least one fold mirror 670. The example shown included two fold mirrors 670, one associated with reticle 306 and one associated with substrate 310. When fold mirrors 670 are used, the associated element, either reticle 306 or substrate 310, is rotated 90° compared to when fold mirrors 670 are not used (e.g., the reticle and the substrate are in a same plane in FIGS. 4 and 5, while in FIG. 6 the reticle and substrate are in parallel planes and possible positioned opposite each other).

In various examples, either one or both of concave mirrors 630 and 634 and/or one or both of fold mirrors 670 can be active. In one example, the adjustability of fold mirrors 670 is performed similar to mirrors 430 and 434, as is discussed above. Through use of one or more active fold mirrors 670, mirrors 630 and 634 no longer need to be active, so long as at least one mirror 630, 634, or 670 is active, which is discussed in more detail below.

In one example, using fold mirror 670 as an active mirror allows for better spatial resolution when correcting non-flatness errors for substrate 310. For example, having an active mirror 630 or 634 non-flatness errors may be correctable about every 100 mm on the reticle. However, using an active fold mirror 670 can allow for focus corrections about every 10 mm.

It is to be appreciated that there is an optimal position for fold mirror(s) 670 related to: (a) a size of a region that needs a focus correction and/or actuator size and (b) arrangement, e.g., a physical design of an actuator and how densely spaced the actuators are relative to each other. It is also to be appreciated that, aside from making fold mirror 670 active, moving fold mirror 670 towards and away from either its respective mirror 430 or 434 or reticle 306 or substrate 310 also changes a beam size and/or location on substrate 310. For example, moving one or both fold mirrors 670 away from a respective mirror 630 or 634 makes a beam size smaller. Thus, moving a respective fold mirror 670 away from a respective mirror 630 or 634 means the beam will cover a smaller area on substrate 310.

In one example, it is desirable to have fold mirror 670 as close to reticle 306 as possible When this is done, an image position and size on fold mirror 670 changes. For example, bringing reticle 306 to a few hundredths of a millimeter away from fold flat 670 makes the beam size about 12 mm in diameter. In order to make a focus correction over that 12 mm diameter, at least three actuators will be required. Thus, three actuators must be able to fit within a 12 mm diameter on fold mirror 670. In some applications, this may be difficult, which determines a limitation or tolerance of a spacing between fold mirror 670 and reticle 306. For example, if it is only possible to have three actuators every 12 mm, fold mirror 670 must be spaced from reticle 306 to allow for a beam size of that amount.

In another example, referring to the previous or present embodiments, one or more of the fold or concave mirrors can have an irregularity or surface error (e.g., a polishing error). This can be measured, and the measurement used to compensated for the polishing error through use of one of the mirrors being an active mirror. The measuring can be done either by directly measuring or through information collection the mirror with the error, similar to as described above, or measuring a wave front of the mirror with the error for aberrations, as would become apparent to one of ordinary skill in the art.

In this example, it is desirable to have as many actuators as possible in the active mirror. For example, to correct polishing errors on the surface, upwards of 10 or 15 actuators may be used to cover an area of half-inch diameter.

In one example, although a mirror may be free from defects after manufacture, they may become distorted after being mounted in a lithography system. This distortion can also be measured and compensated for, using the methods as described above.

In one example, using active mirrors allows for correction or compensation for magnification errors. This may be caused from changing of reticles during an exposure process. For example, if a first reticle has a smaller thickness compared to a second reticle, the second reticle is position closer to, respectively, one of the concave mirrors or the fold mirrors. When this distance is smaller, the image on substrate 310 is not going to be positioned correctly, for example the image may be shifted upwards. Thus, in this example an object distance and an image distance are not the same, which causes a magnification error. To compensate for this, either one or more of the fold and/or concave mirrors can have their curvatures adjusted or deformed to return the system back to a desired magnification condition. It is to be appreciated that magnification correction and focus correction can be decoupled.

Exemplary Operation

Figure 7:
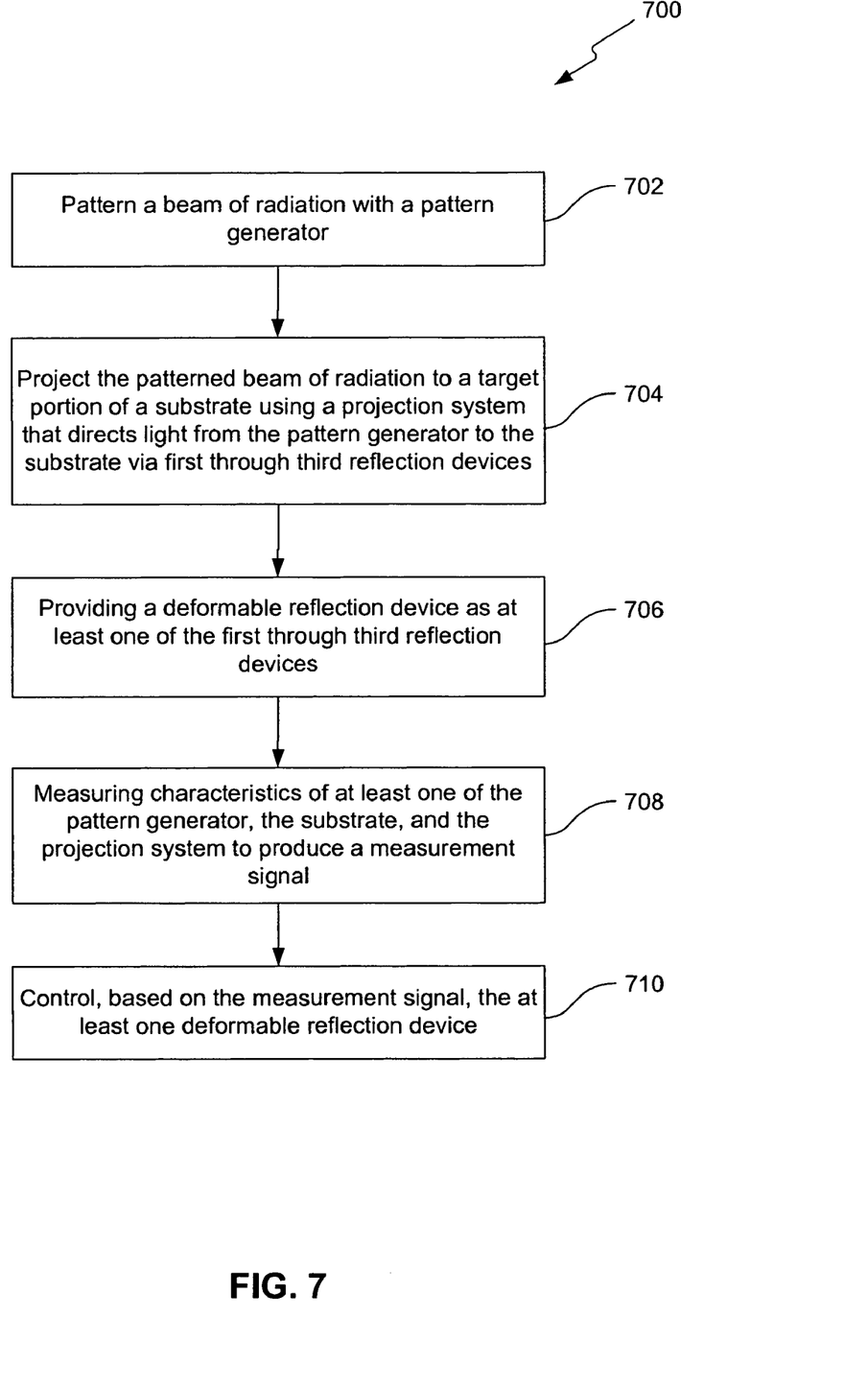
FIG. 7 shows a flowchart depicting a method, according to one embodiment of the present invention.

FIG. 7 is a flowchart depicting a method 700, according to one embodiment of the present invention in which one or more of the embodiments or example above are employed. In step 702, a beam is patterned with a pattern generator. In step 704, the patterned beam of radiation is projected onto a target portion of a substrate using a projection system that directs light from the pattern generator to the substrate via first through third reflection devices. In step 706, an active reflection device is provided as at least one of the first through third reflection devices. In step 708, characteristics of at least one of the pattern generator, the substrate, and the projection system are measured to produce a measurement signal. In step 710, the at least one active reflection device is controlled based on the measurement signal.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithography system, comprising,
a pattern generator;
a projection system that directs light from the pattern generator to a substrate comprising,
a first concave mirror;
a convex mirror; and
a second concave mirror, such that light patterned by the pattern generator is received at the first concave mirror, directed to the convex mirror, then directed to the second concave mirror, before being directed towards the substrate;
a measurement system that measures characteristics about at least one of the pattern generator, the substrate, and the projection system and produces a measurement signal; and
a controller that, based on the measurement signal, produces a control signal to deform the at least one deformable reflection device,
wherein one of the first and second concave mirrors is the at least one deformable reflection device.

2. The lithography system of claim 1, wherein the pattern generator comprises a static pattern generator.

3. The lithography system of claim 2, wherein the static pattern generator comprises a reticle or a mask.

4. The lithography system of claim 1, wherein the substrate comprises a flat panel display, an integrated circuit, and mask.

5. The lithography system of claim 1, wherein the characteristic comprises at least one of a surface topography of the pattern generator or the substrate or optical characteristics of at least one of the first through third reflection devices.

6. The lithography system of claim 1, wherein the pattern generator comprises a reflective pattern generator or a transmissive pattern generator.

7. The lithography system of claim 1, wherein both of the first and second concave mirrors are the at least deformable reflection devices.

8. The lithography system of claim 1, wherein the projection system further comprises:
a fold mirror positioned to direct light from the pattern generator to the first reflection device.

9. The lithography system of claim 8, wherein the fold mirror is a deformable mirror.

10. The lithography system of claim 1, wherein the projection system further comprises:
a fold mirror positioned to direct light from the third reflection device to the substrate.

11. The lithography system of claim 10, wherein the fold mirror is a deformable mirror.

12. The lithography system of claim 1, wherein the projection system further comprises:
a first fold mirror positioned to direct light from the pattern generator to the first reflection device; and
a second fold mirror positioned to direct light from the pattern generator to the second reflection device.

13. The lithography system of claim 12, wherein at least one of the first and second fold mirrors is a deformable mirror.

14. The lithography system of claim 12, wherein both of the first and second fold mirrors are deformable mirrors.

15. The lithography system of claim 1, further comprising:
piezoelectric actuators, motor actuators, thermal actuators, or hydraulic pressure actuators to cause the deformation.

16. The lithography system of claim 1, wherein the at least one deformable mirror comprises an integrated circuit formed actuator system.

17. The lithography system of claim 1, wherein the measurement system comprises:
a moveable sensor proximate a surface of one of the pattern generator or the substrate, wherein the moveable sensor scans the surface.

18. The lithography system of claim 17, wherein the moveable sensor scans the surface one of before or during an exposure operation.

19. The lithography system of claim 17, wherein the moveable sensor scans the surface before and during an exposure operation.

20. The lithography system of claim 1, wherein the measurement system comprises:
   a first moveable sensor proximate a surface of the pattern generator; and
   a second moveable sensor proximate a surface of the substrate.

21. The lithography system of claim 1, wherein the measurement system comprises:
   an array of sensors proximate a surface of at least one of the substrate or the pattern generator.

22. The lithography system of claim 1, wherein the measurement system provides real-time feedback to the controller to control at least one of magnification or focus errors.

23. A method of making of device, comprising:
   patterning a beam of radiation with a pattern generator;
   projecting the patterned beam of radiation to a target portion of a substrate using a projection system that directs light from the pattern generator to the substrate through reflecting the light from a first concave mirror to a convex mirror to a second concave mirror and then onto the substrate;
   providing at least one deformable reflection device as at least one of the first or second concave mirrors;
   measuring characteristics of at least one of the pattern generator, the substrate, and the projection system to produce a measurement signal; and
   controlling, based on the measurement signal, the at least one deformable reflection device.

24. A system, comprising,
   a pattern generator;
   a projection system that directs light from the pattern generator to a substrate comprising,
      a first concave mirror,
      a convex mirror, and
      a second concave mirror, such that light patterned by the pattern generator is received at the first concave mirror, directed to the convex mirror, then directed to the second concave mirror, before being directed towards the substrate;
   a measurement system that measures characteristics about at least one of the pattern generator, the substrate, and the projection system and produces a measurement signal; and
   a controller that, based on the measurement signal, and produces a control signal to deform the at least one deformable reflection device;
   wherein both of the first and second concave mirrors are the at least one deformable reflection devices.

* * * * *